United States Patent [19]
Kotlyar

[11] Patent Number: 5,828,143
[45] Date of Patent: Oct. 27, 1998

[54] MAGNETOSTRICTIVE METHOD AND APPARATUS FOR PROPELLING AN OBJECT

[76] Inventor: Oleg Kotlyar, 4675 W. 3825 South, Salt Lake City, Utah 84120

[21] Appl. No.: 934,957

[22] Filed: Sep. 22, 1997

[51] Int. Cl.$^6$ .................................................. H01L 41/06
[52] U.S. Cl. ............................................................. 310/26
[58] Field of Search ............................ 310/26; 318/118; 335/215

[56] References Cited

U.S. PATENT DOCUMENTS

| | | | |
|---|---|---|---|
| 5,231,887 | 8/1993 | Arvidsson et al. | 74/88 |
| 5,389,845 | 2/1995 | Brimhall | 310/26 |
| 5,694,097 | 12/1997 | Nilsson | 335/4 |

*Primary Examiner*—Steven L. Stephan
*Assistant Examiner*—Judson H. Jones
*Attorney, Agent, or Firm*—Alan D. Kirsch

[57] ABSTRACT

A magnetostrictive method and apparatus for propelling an object through a medium wherein one end of a magnetostrictive rod is firmly attached to a housing connected to the object and the other end of the rod is in contact, direct or through a flexible membrane, with the medium. Magnetic field pulses are created by energizing a coil located radially around and proximate to the magnetostrictive rod, said magnetic field pulses causing the rod to rapidly expand and contract longitudinally, in the presence and absence, respectively, of the magnetic field. A plurality of magnetostrictive rods can also be used to propel the object.

16 Claims, 3 Drawing Sheets

MAGNETOSTRICTIVE METHOD AND APPARATUS FOR PROPELLING AN OBJECT

BACKGROUND OF INVENTION

The present invention relates to a method and apparatus for propelling an object through a medium using a magnetostrictive linear motor.

Magnetostrictive materials, which change shape when exposed to a magnetic field, have been known for over a century. Many attempts have been made to adapt them for commercial products such as micropositioners, low-frequency sonar transmitters and fast-acting switches and relays. However, compared with piezoceramic and electrostrictive materials, current magnetostrictive materials typically produced lower strains, making them impractical for many applications.

The magnetostrictive material Terfenol-D offers strains significantly greater than previous magnetostrictive materials. Terfenol-D is an alloy of terbium, dysprosium and iron, discovered at the Naval Surface Weapons Center in Silver Springs, Md. Terfenol-D has been shown to offer strains forty times greater that conventional magnetostrictive materials and performance characteristics greater than piezoceramic and electrostrictive devices.

As a result of the enhanced characteristics of the current magnetostrictive materials, new applications for magnetostrictive linear motors are now possible.

It is an object of the present invention to provide a method for propelling an object through a medium using magnetostrictive linear motion.

It is another object of the present invention to provide a a magnetostrictive apparatus capable of propelling a object through a medium.

It is still a further object of this invention to provide a nonpolluting method and apparatus for propelling an object through a medium.

Additional objects, advantages and novel features of the invention will become apparent to those skilled in the art upon examination of the following and by practice of the invention.

SUMMARY OF THE INVENTION

The above and other objects are achieved in accordance with the present invention by utilizing a magnetostrictive linear motor attached to an object that is desired to be propelled through a medium, such as on the water surface or below the water surface or other medium having a sufficient density.

The present invention is comprised of a sealed housing having an internal sealed chamber, a rod comprised of a magnetostrictive material, said magnetostrictive rod having the capability to rapidly expand and contract along a longitudinal axis in the presence and absence, respectively, of a magnetic field, electrical means for applying magnetic field pulses proximate to said magnetostrictive rod. Additionally, electronic control means can be provided for controlling the frequency and magnitude of a electrical current which creates the magnetic field.

A method for propelling an object through a medium is also disclosed, said method comprising providing a magnetostrictive rod within a sealed chamber of a propulsion apparatus housing, said housing being removably attached to the object of interest, said magnetostrictive rod being comprised of a material capable of rapidly expanding longitudinally in response to the presence of a magnetic field and being further capable of rapidly contracting longitudinally in the absence of a magnetic field, said magnetostrictive rod further having a first end removably attached to the propulsion apparatus housing and a second end in contact with a flexible membrane contacting the medium containing the object of interest; pulsing a solenoid coil located in radial proximity around said magnetostrictive rod with electric current to produce a magnetic field proximate to the magnetostrictive rod, said proximate magnetic field being sufficient to cause the magnetostrictive rod to expand in a longitudinal direction, said expansion creating sufficient pressure in the medium to propel the attached object of interest.

DETAILED DESCRIPTION OF THE INVENTION

Figure 1:
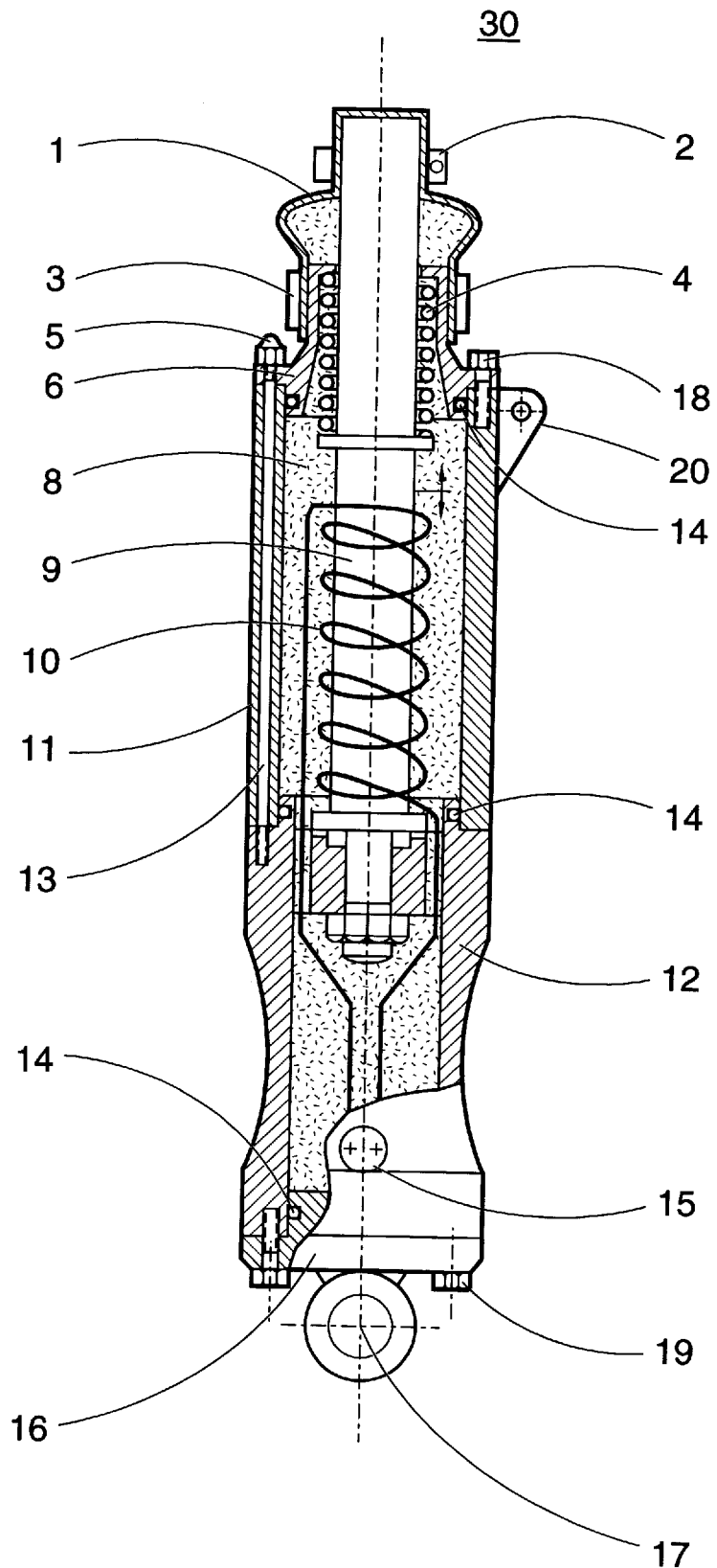
FIG. 1 is an elevational view, partly in section, of the magnetostrictive linear motion device of the present invention.

Referring now to FIG. 1 the magnetostrictive propulsion apparatus 30 of the present invention is shown. The magnetostrictive propulsion apparatus 30 is comprised of a main housing 12, front housing end 11, front cover 6 and rear housing end 16. As shown in FIG. 1, front housing end 11, front cover 6 with flexible membrane 1 (diaphragm) and rear housing end 16 are connected to the main housing 12 in a manner to form a sealed chamber 8 (i.e., cavity or compartment) within the housings. The front housing end 11 is removably connected to the main housing 12 by multiple studs 13, crown nuts 5 and screws 18. 0-rings 14 are used to seal a fluid within chamber 8. Preferably, the fluid sealed within chamber 8 is an oil which serves to protect magnetostrictive rod 9 and other parts within the chamber 8 against corrosion. In an alternate embodiment of the present invention, a single housing having a sealed chamber can be used, thereby eliminating the necessity of bolting or otherwise connecting the main, front and rear housing ends.

A flexible membrane 1 is attached to the front cover 6 by means of a clamp 3. Preferably clamp 3 is a metal band tightly fastened around the circumference of front cover 6. However, it should be appreciated that other means may be used to secure the flexible membrane to the front cover, such as bolts, adhesives, or corresponding interlocking shapes of the flexible membrane and housing end.

Within chamber 8 is a cylindrically shaped magnetostrictive rod 9 having an end which is firmly attached to the main housing end 12. The opposite end of the magnetostrictive rod 9 is in contact with the flexible membrane 1. In a preferred embodiment of the invention, the flexible membrane 1 is made to conform to the cylindrical shaped end of the magnetostrictive rod 9 by means of a metal band clamp 2 around the flexible membrane 1 and rod 9.

A preloading spring 4 compresses the magnetostrictive rod 9, the preloading force thereby increasing the magnetostrictive rod's strain.

An electrical solenoid coil 10 surrounds the magnetostrictive rod 9 within the chamber 8. The electrical coil 10 is connected to a controller block (not shown) which controls magnitude and frequency of pulses of electrical current through the electrical coil 10. The controller block can be located in the propelling apparatus or can be located on the object being propelled. A pulse of electrical current through the coil 10 creates a magnetic field proximate to the magnetostrictive rod 9. The magnetic field causes the magnetostrictive rod 9 to expand along its longitudinal axis. The degree of expansion is proportional to the applied magnetic field. During magnetostrictive rod 9 expansion, the free end of the rod moves with high speed, the rod end speed being a directly proportional to the speed of change the current through the solenoid coil 10. The rod's free end moves with high speed and compressed the medium (e.g., water, air, gas, or other liquids and gases) thereby creating increased pressure in the compressed medium. The force caused by this pressure is applied axially to the magnetostrictive rod's 9 free end and is transmitted through the propulsion apparatus housing 12, the rear housing end 16 and through the pin connecting the propelling apparatus 30 with the object being propelled. This force has to overcome the inertia of the object and medium resistance while the object moves. A continuous movement of the object is achieved by consecutive generation of the above described force pulses. An example of such a pulsing non-stop movement is an oar-boat motion. In the present invention, the central rod 9 works as a "magnetostrictive oar".

A relationship between axial force applied to the magnetostrictive rod's free end, and rod free end speed of expansion is shown below.

$$F = \Delta p * A = \rho * W * C * A \quad (1)$$

where F—the force applied to the free end of the magnetostrictive rod,

Δp—the change of pressure in the medium caused by the linear expansion of the magnetostrictive rod and proximate to the magnetostrictive rod free end, A—the active area of the magnetostrictive rod free end, ρ—the density of the medium surrounding the free end of the magnetostrictive rod, W—the displacement speed of the rod free end upon linear expansion C—the speed of sound in the medium.

It follows from Equation 1 that an appropriate speed W of the rod free end extension has to be provided for a given medium (ρ) and rod free end active area (A), in order to obtain the required propelling force (F) for the object.

For an underwater propulsion apparatus embodiment of the present invention, a hydrostatic pressure has to affect evenly all surfaces of the magnetostrictive rod. As a result of this, the propulsion apparatus can be used at any depth. An additional advantage of the present propulsion apparatus is that it is quiet even at frequencies of magnetostrictive rod expansion pulses of up to 100 Hz.

Figure 2:
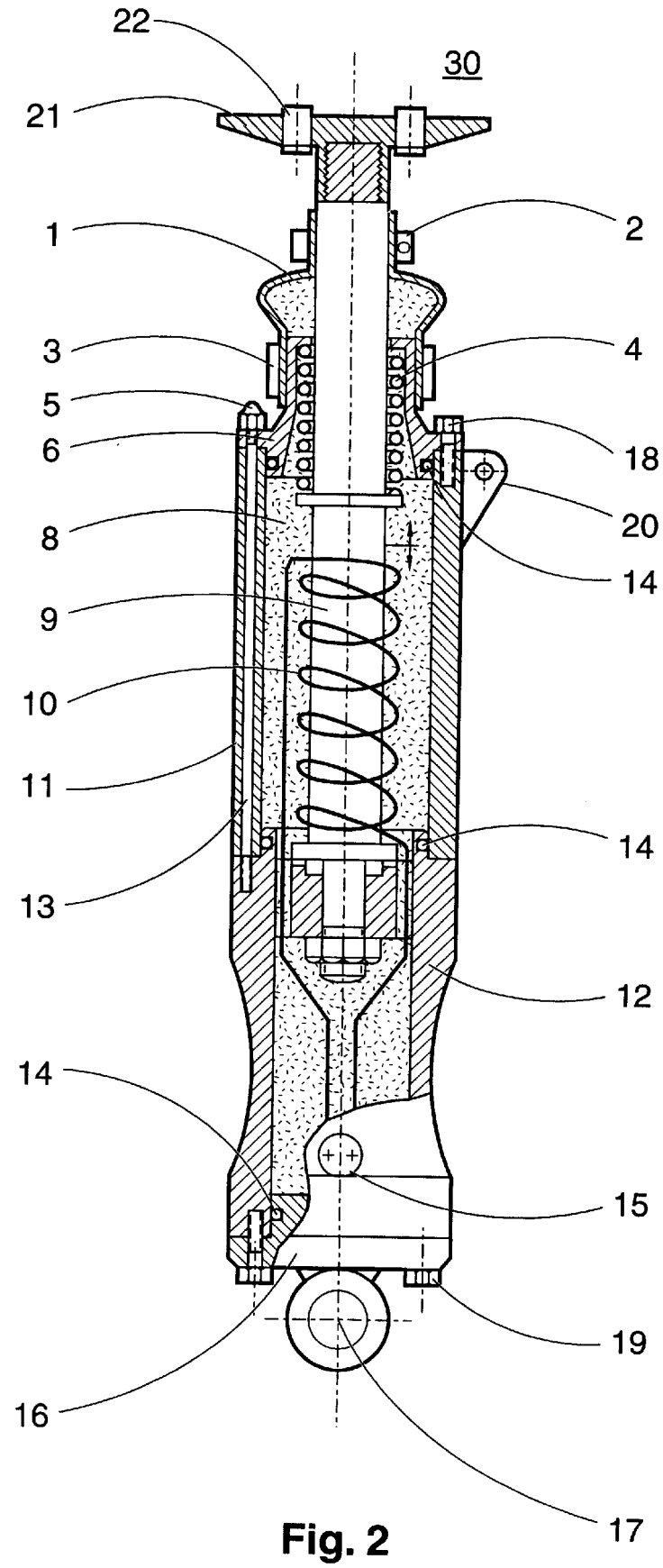
FIG. 2 is an elevational view, partly in section, of an alternate embodiment of the present invention.

Referring now to FIG. 2, an alternate embodiment of the invention is shown in which like numerals are utilized from FIG. 1. As shown in FIG. 2, an extension 21 is affixed to the free end of the magnetostrictive rod 9 in order to increase the area of the rod end (i.e., "A" in Equation 1). Check valves 22 are attached to the extension 21. Check valves 22 are in a closed position during expansion of magnetostrictive rod 9 and in an open position during the contraction stroke of the rod 9 so that the ambient medium freely passes through the check valves 22. Use of the extension 21 and check valves results in greater force being exerted by the rod in the medium at a given speed of the rod's free end.

Figure 3:
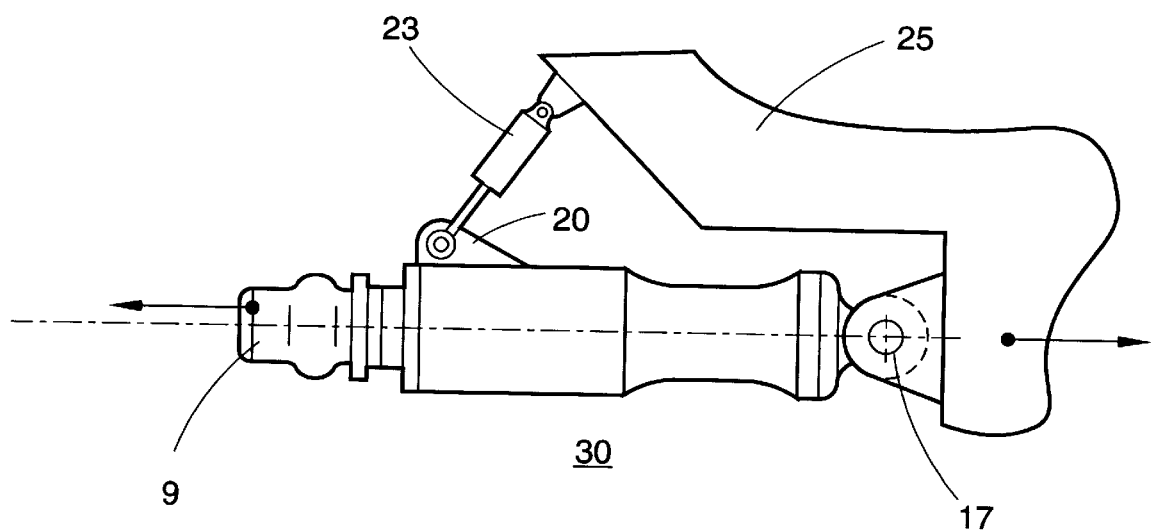
FIG. 3 is an elevational view showing the propulsion apparatus of the present invention attached to the object of interest.

Coupling means is provided for attaching the propulsion apparatus to an object of interest to be propelled through the medium. For example, as shown in FIG. 3, the propulsion apparatus 30 of the present invention is secured to the object of interest 25 being propelled by means of a pin 17 (pivot point means). Additionally, brackets 20 can be used to provide a mechanism to change the direction of the propelled object through the use of control means such as hydraulic cylinder 23. The control means shown in FIG. 3 provide a means for controlling the direction in one plane. Obviously, alternative bracketing and pivoting means can be used for two dimensional direction control. Additionally, multiple number of propulsion apparatuses can be connected to the object of interest to increase the propulsive force. In such a configuration, controlling individually the speed of the expansion for each of the multiple magnetostrictive rods can be used for direction control. Furthermore, in another embodiment of the invention, a multiple number of propulsion apparatuses can be connected as a cluster or bundle to a common extension, thereby increasing the propulsive force applied to the object of interest.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiments described explain the principles of the invention and practical application and enable others skilled in the art to utilize the invention in various embodiments and with various modifications as are suited to the particular use contemplated. It is intended that the scope of the invention be defined by the claims appended hereto.

I claim:

1. A magnetostrictive device for propelling an object through a medium, comprising:

a sealed housing having an internal sealed chamber, said internal sealed chamber having a rigid first end and an opposing second end comprising a flexible membrane;

means for attaching said housing to an object to be propelled through a medium;

a magnetostrictive rod having a longitudinal axis between opposite first and second ends, the first end of the magnetostrictive rod being removably attached to the rigid first end of the internal sealed chamber, the second end of the magnetostrictive rod being in contact with the flexible membrane, the magnetostrictive rod being comprised of a material capable of rapidly expanding longitudinally in response to the presence of a magnetic field and being further capable of rapidly contracting longitudinally in the absence of the magnetic field;

electrical means for applying a magnetic field pulses proximate to the magnetostrictive rod for magnetostrictive elongation along the longitudinal axis of the magnetostrictive rod, the elongation creating, at the second end of the magnetostrictive rod, a force sufficient to propel the object through the medium; and electrical control means for controlling magnetic field pulse magnitude and frequency proximate to the magnetostrictive rod.

2. The device of claim 1 wherein the magnetostrictive rod is comprised of a tertiary rare earth alloy of terbium-dysprosium-iron.

3. The device of claim 1 further comprising an extension attached to said second end of the magnetostrictive rod, the extension having check valves which are in a closed position during the elongation of the magnetostrictive rod, and in an open position during contraction of the magnetostrictive rod, said extension and check valves providing an increased force for propelling the object through the medium than would otherwise be provided in the absence of the extension and check valves.

4. The device of claim 1 wherein the sealed chamber is filled with a fluid for protecting the magnetostrictive rod against corrosion.

5. The device of claim 1 wherein the electrical means comprises an electrical solenoid coil in radial proximity around the magnetostrictive rod between said first and second magnetostrictive rod ends.

6. The device of claim 1 wherein the medium through which the object is propelled is water.

7. A method for propelling an object of interest through a medium, comprising:

providing a magnetostrictive rod within a sealed chamber of a propulsion apparatus housing, said housing being removably attached to the object of interest, said magnetostrictive rod being comprised of a material capable of rapidly expanding longitudinally in response to the presence of a magnetic field and being further capable of rapidly contracting longitudinally in the absence of a magnetic field, said magnetostrictive rod further having a first end removably attached to the propulsion apparatus housing and a second end in contact with a flexible membrane contacting the medium containing the object of interest;

pulsing a solenoid coil located in radial proximity around said magnetostrictive rod with electric current to produce a magnetic field proximate to the magnetostrictive rod, said proximate magnetic field being sufficient to cause the magnetostrictive rod to expand and contract in a longitudinal direction, said expansion and contraction creating sufficient pressure in the medium to propel the attached object of interest.

8. The method of claim 7 wherein the magnetostrictive rod is comprised of a tertiary rare earth alloy of terbium-dysprosium-iron.

9. A magnetostrictive device for propelling an object through a medium, comprising:

a plurality of sealed housings each of said housings having an internal sealed chamber, said internal sealed chambers having a rigid first end and an opposing second end comprising a flexible membrane;

means for attaching said plurality of housings to an object to be propelled through a medium;

a magnetostrictive rod having a longitudinal axis between opposite first and second ends, the first end of the magnetostrictive rod being removably attached to the rigid first end of the internal sealed chamber of each of the plurality of housings, the second end of the magnetostrictive rod being in contact with the flexible membrane, the magnetostrictive rod being comprised of a material capable of rapidly expanding longitudinally in response to the presence of a magnetic field and being further capable of rapidly contracting longitudinally in the absence of the magnetic field;

electrical means for applying a magnetic field pulses proximate to the magnetostrictive rod for magnetostrictive elongation along the longitudinal axis of the magnetostrictive rod, the elongation creating, at the second end of the magnetostrictive rod, a force sufficient to propel the object through the medium; and electrical control means for controlling a frequency and magnitude of magnetic field pulses proximate to the magnetostrictive rod.

10. The device of claim 9 further comprising electronic control means for controlling magnitude and frequency of the magnetic field pulses.

11. The device of claim 9 wherein the magnetostrictive rod attached to each of the plurality of housings is comprised of a tertiary rare earth alloy of terbium-dysprosium-iron.

12. The device of claim 9 further comprising an extension attached to said second end of each of the magnetostrictive rods, the extension having check valves which are in a closed position during the elongation of the magnetostrictive rod, and in an open position during contraction of the magnetostrictive rods, said extension and check valves providing an increased force for propelling the object through the medium than would otherwise be provided in the absence of the extension and check valves.

13. The device of claim 9 wherein each of the sealed chamber is filled with a fluid for protecting the magnetostrictive rod against corrosion.

14. The device of claim 9 wherein the electrical means comprises an electrically conductive coil in radial proximity around the magnetostrictive rods between said first and second magnetostrictive rods ends.

15. The device of claim 9 wherein the medium through which the object is propelled is water.

16. The device of claim 9 wherein the plurality of magnetostrictive rods can be connected with a common extension to increase the propulsive force.

* * * * *